(12) United States Patent
Shiokawa

(10) Patent No.: US 6,472,311 B1
(45) Date of Patent: Oct. 29, 2002

(54) METHOD FOR MANUFACTURING SEMICONDUCTOR DEVICE

(75) Inventor: Nagamasa Shiokawa, Nobeoka (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 09/719,688
(22) PCT Filed: May 12, 1999
(86) PCT No.: PCT/JP99/02441

§ 371 (c)(1),
(2), (4) Date: Dec. 15, 2000

(87) PCT Pub. No.: WO00/70663
PCT Pub. Date: Nov. 23, 2000

(51) Int. Cl.$^7$ .......................................... H01L 21/4763
(52) U.S. Cl. ..................... 438/630; 438/655; 438/656; 438/658; 438/664; 438/682
(58) Field of Search ................ 438/680, 655, 438/656, 658, 664, 682, 683

(56) References Cited

U.S. PATENT DOCUMENTS

| | | | |
|---|---|---|---|
| 4,640,844 A | 2/1987 | Neppl et al. | 427/38 |
| 5,849,634 A | * 12/1998 | Iwata | 438/655 |
| 6,136,658 A | * 10/2000 | Shinmura | 438/305 |
| 6,197,646 B1 | 3/2001 | Goto et al. | 438/301 |

FOREIGN PATENT DOCUMENTS

| | | |
|---|---|---|
| JP | 61043464 | 3/1986 |
| JP | 04037163 | 2/1992 |
| JP | 05259115 | 10/1993 |
| JP | 09064349 | 3/1997 |
| JP | 11145080 | 5/1999 |

OTHER PUBLICATIONS

Derwent Abstract Accession No. 98–452266/39, JP 10–189962 A (OKI Electric Ind Co Ltd) Jul. 21, 1998.

* cited by examiner

Primary Examiner—David Nelms
Assistant Examiner—Reneé R. Berry
(74) Attorney, Agent, or Firm—Finnegan, Henderson, Farabow, Garrett & Dunner, L.L.P.

(57) ABSTRACT

To shorten a process for manufacturing a semiconductor device comprising a silicide and a non-silicide diffusion layers and to form a stable and highly homogenous non-silicide diffusion layer, ions are implanted to form a source/drain diffusion layer and then the substrate is subjected to rapid thermal oxidation in a short time to activate the ions while forming a new oxide film. A thermal oxide film (6) consisting of the new oxide film including a protective oxide film (3) is etched to form an oxide film for preventing silicidation (8), a Ti film (9) is formed over the whole surface including the oxide film for preventing silicidation (8), the product is annealed for silicidation and the unreacted Ti film (9) is removed. Thus, a diffusion layer (4) as a non-silicide layer which is little silicided and a diffusion layer (5) whose surface is a silicide layer (10) are formed.

7 Claims, 4 Drawing Sheets

METHOD FOR MANUFACTURING SEMICONDUCTOR DEVICE

TECHNICAL FIELD

This invention relates to a process for manufacturing a semiconductor device where a refractory metal silicide is formed on the surface of a diffusion layer. In particular, it relates to a process for manufacturing a semiconductor device where diffusion layers with and without a refractory metal silicide on their surfaces are formed on the same substrate.

BACKGROUND ART

Generally, shrinking a semiconductor integrated circuit causes increase in a resistance in a diffusion layer. To avoid the problem, it is known that a refractory metal silicide is formed on the surface of the diffusion layer to reduce a resistance in the diffusion layer (hereinafter, a diffusion layer on which a refractory metal silicide layer is formed is referred to as a silicide diffusion layer.).

On the other hand, it is known in a semiconductor device where an MOS device is integrated that a protective resistance consisting of a high-resistivity diffusion layer is provided for protecting a semiconductor device from electrostatic discharge damage due to external static electricity.

Thus, there has been a need for a technique for forming a low-resistivity silicide diffusion layer and a high-resistivity diffusion layer without a refractory metal silicide layer on its surface (hereinafter, referred to as a "non-silicide diffusion layer") on the same semiconductor substrate, and various proposals have been made.

For example, Japanese Patent Application Laid-Open No. 61-43464 has disclosed a process for forming an oxide film for preventing silicidation in a region not to be silicided.

The manufacturing process comprises the steps illustrated in FIGS. 3 and 4.

First, on a silicon substrate 1 is formed an LOCOS region 2 for separating devices and after forming a gate, is formed a protective oxide film 3 with a thickness of 150 Å for source-drain type of ion implantation. Then, $As^+$ or $BF_2^+$ ions are implanted as a dopant and the product is annealed to form a high-concentration dopant diffusion layer 4, 5 as a source-drain (FIG. 3(a)).

After removing the protective oxide film 3, a thick oxide film 3a for forming a non-silicide diffusion layer is formed by CVD technique (FIG. 3(b)).

A photoresist 7 is formed on a region corresponding to the diffusion layer 4 which is not to be silicided (FIG. 3(c)), the oxide film 3a is etched using the photoresist 7 as a mask, and the photoresist 7 is removed to form an oxide film 8 for preventing silicidation (FIG. 3(d)).

The silicon substrate 1 is washed before forming a metal film, titanium Ti is deposited by, for example, sputtering to form a Ti film 9 (FIG. 4(a)) and the product is subject to annealing/siliciding to form a silicide diffusion layer 10 on the diffusion layer 5 (FIG. 4(b)). Then, the unreacted Ti film 9 is removed by selective etching and is subject to resist-reducing annealing (FIG. 4(c)). After these steps, the silicide diffusion layer 10 is formed only on the surface of the diffusion layer 5.

Japanese Patent Application Laid-Open No. 4-37163 has disclosed that a polycrystalline silicon layer similar to a gate electrode in an MOS transistor is formed in a non-silicide region to prevent a diffusion layer from being silicided.

In the above process for forming a silicide and a non-silicide diffusion layers, a protective oxide film for ion implantation is removed, an oxide film or a polycrystalline silicon layer is formed for forming a silicide diffusion layer and the product is etched to form an oxide film for preventing silicidation. It is because the protective oxide film for ion implantation is originally thin for promoting ion permeation and further the protective oxide film damaged by ion implantation has poor film quality due to, for example, many defects so that its blocking performance to Ti deposition by sputtering in a subsequent step is inappropriately deteriorated.

Thus, when an oxide film for preventing silicidation is separately formed for forming a silicide and a non-silicide diffusion layers, the number of steps increases.

Japanese Patent Application Laid-Open No. 9-64349 has disclosed that a dopant concentration during ion implantation is varied without separately forming such an oxide film for preventing silicidation, to reduce the steps. According to this manufacturing process, increase in a dopant concentration causes forming a knock-on layer on the surface of a diffusion layer and thus silicidation reaction is inhibited, resulting in formation of a high-resistivity refractory metal silicide.

In the above technique, it is, however, difficult to control a resistance and the inside of a wafer is inadequately homogeneous.

An object of this invention for solving the problems in the prior art is to provide a process for manufacturing a semiconductor device, which can shorten the process for manufacturing a semiconductor device comprising a silicide and a non-silicide diffusion layers and can form an adequately homogeneous and stable non-silicide diffusion layer (high-resistivity diffusion layer).

DISCLOSURE OF THE INVENTION

In order to achieve the objective, this invention provides a process for manufacturing a semiconductor device comprising the steps of implanting ions into a silicon substrate, heating the substrate for activating the ions to form a diffusion layer and then forming a silicide and a non-silicide diffusion layers, characterized in that in the step of heating the substrate for activating the ions, oxygen is fed to form an oxide film for preventing silicidation.

The oxide film has a thickness of at least 100 Å.

Furthermore, in the heating step, rapid thermal oxidation is conducted.

Specifically, in the process for manufacturing a semiconductor device, after implanting ions into the silicon substrate, oxygen is fed during heating for activating the implanted ions, whereby the ions are activated while an oxide film for subsequently preventing silicidation is formed.

A step for separately forming an oxide film for preventing silicidation can be, therefore, eliminated, leading to a shortened manufacturing process.

Since an oxide film is formed with a thickness of at least 100 Å, it is possible to provide an oxide film for preventing silicidation which ensures adequate reliability.

The oxide film for preventing silicidation is formed by rapid thermal oxidation. Specifically, heating is conducted, for example, at about 950° C. to about 1150° C. both inclusive for about 1 min to about 10 min both inclusive to form an oxide film for a short time, so that dopant diffusion due to thermal diffusion can be prevented and shallow junction can be formed.

Furthermore, this invention provides a process for manufacturing a semiconductor device comprising the steps of forming an insulating region for separating devices on a silicon substrate;

implanting ions to an activated region made of a silicon layer between the insulating regions for separating devices for forming a diffusion layer;

activating the ions while heating the activated region to form an oxide film for preventing silicidation on the region;

removing the oxide film for preventing silicidation on a region to be silicided;

forming a refractory metal layer and then annealing the product to silicide a silicon layer in the region to be silicided; and removing an unreacted refractory metal layer, wherein a silicide and a non-silicide diffusion layers are formed on the same substrate.

The oxide film for preventing silicidation has a thickness of at least 100 Å.

In the heating step for activating the ions while forming the oxide film for preventing silicidation, oxygen is fed during heating for conducting rapid thermal oxidation.

The rapid thermal oxidation is conducted at 950° C. to 1150° C. both inclusive for 1 min to 10 min both inclusive.

Specifically, this process for manufacturing a semiconductor device comprises the steps of forming an insulating region for separating devices on a silicon substrate;

implanting ions to an activated region made of a silicon layer between the insulating regions for separating devices;

heating the substrate for activating the ions while forming an oxide film for preventing silicidation on the activated region;

removing the oxide film for preventing silicidation on a region to be silicided;

forming a refractory metal layer and then annealing the product to silicide a silicon layer in the region to be silicided; and removing an unreacted refractory metal layer, whereby a silicide and a non-silicide diffusion layers are formed on the same substrate.

Since during the heating step for activating the ions, the oxide film for preventing silicidation in the activated region is formed by the heating, a step for separately forming an oxide film for preventing silicidation can be, therefore, eliminated, leading to a shortened manufacturing process.

Since an oxide film is formed with a thickness of at least 100 Å, it is possible to provide an oxide film for preventing silicidation which ensures adequate reliability.

The steps of heating for activating the ions and forming the oxide film for preventing silicidation are conducted by rapid thermal oxidation where the substrate is heated while feeding oxygen at 950° C. to 1150° C. both inclusive for 1 min to 10 min both inclusive. Therefore, an oxide film is formed for a short time, so that dopant diffusion due to thermal diffusion can be prevented and shallow junction can be formed. The process is not strictly limited to the condition of 950° C. to 1150° C. both inclusive, but a temperature of about 950° C. to about 1150° C. both inclusive may be acceptable. Similarly, the process is not strictly limited to the condition of 1 min to 10 min both inclusive, but a period of about 1 min to about 10 min both inclusive may be acceptable.

BEST MODE FOR CARRYING OUT THE INVENTION

Figure 1A:
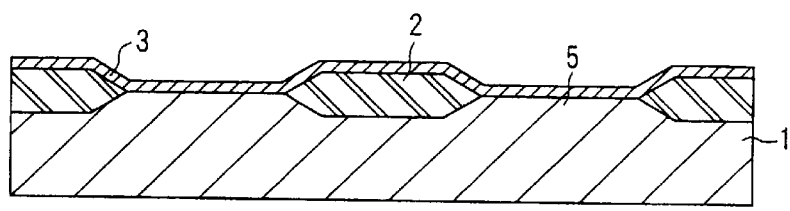
FIG. 1 is a cross section illustrating the first part of a process for manufacturing a semiconductor device comprising a silicide and a non-silicide diffusion layers according to this invention.
Figure 1B:
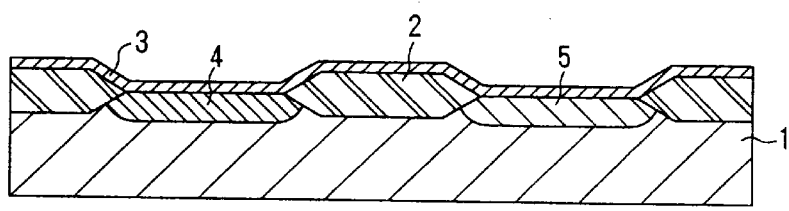
Figure 1C:
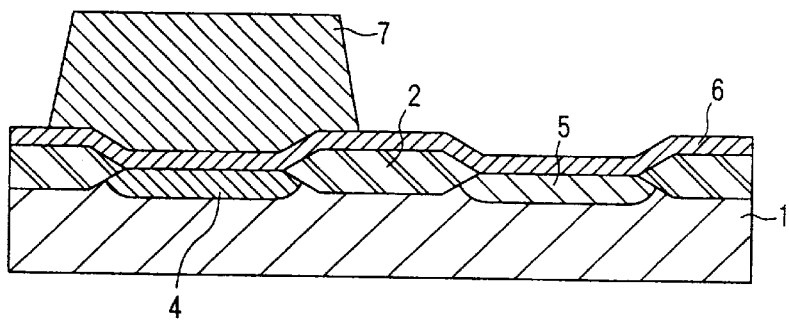
Figure 1D:
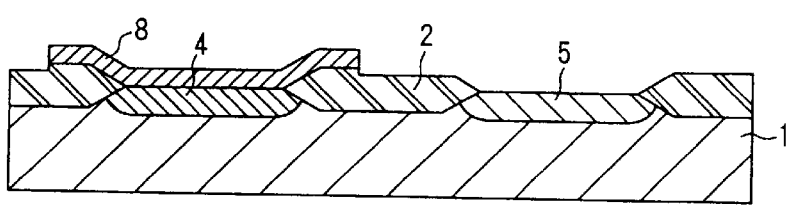

This invention will be described with reference to embodiments.

As illustrated in FIG. 1($a$), on a silicon substrate 1 is formed an LOCOS region 2 for separating devices, on which is then formed a protective oxide film 3 with a thickness of 150 Å. Then, in an nMOS is implanted arsenic ions $As^+$ as $N^+$ ions at 80 kev with a dose of $5 \times E15/cm^2$ while in a pMOS is implanted boron fluoride ions $BF_2^+$ as $P^+$ ions at 60 keV with a dose of $2.5 \times E15/cm^2$. In the process, a gate electrode of MOSFET is formed and the ion-implanted region becomes source/drain dopant diffusion layers 4, 5 after subsequent heating (FIG. 1($b$)).

Then, before heating, the surface of the substrate is washed with a mixed hydrogen peroxide solution of $NH_4OH:H_2O_2:H_2O=0.2:1:10$ (vol/vol/vol) at 50° C. for 15 min.

Then, the product is subjected to rapid heating under an atmosphere of oxygen to simultaneously activate dopants and form an oxide film for preventing silicidation. Specific rapid heating conditions are as follows; the substrate is subjected to thermal oxidation at 950° C. for 2 min to activate the implanted ions while forming a new thermal oxide film with a thickness of 100 Å in an interface between the silicon substrate 1 and the protective oxide film 3, to provide a thermal oxide film 6 with a total thickness of 190 Å or more consisting of the above thermal oxide film and the protective oxide film 3 (FIG. 1($c$)).

The new thermal oxide film on the silicon substrate 1 is required to have a thickness of at least 100 Å, preferably about 100 to 200 Å. Preferable rapid heating conditions are a temperature of about 950° C. to 1150° C. and a heating time of about 1 min to 10 min. For example, a heating temperature of 950° C. requires a heating time of 2 min or more for forming an oxide film with a thickness of 100 Å on the silicon substrate 1. However, at 1150° C., a heating time is preferably about 1 to 2 min because heating for 2 min or longer at 1150° C. may cause heat storage in a heater, which may lead to variation in a film thickness among wafers during mass production.

Then, on the thermal oxide film 6 is formed a photoresist film with a thickness of 13000±1000 Å, which is exposed and then developed to form a photoresist 7 for forming a non-silicide diffusion layer.

Then, as illustrated in FIG. 1($d$), the sample is etched with an $NH_4F:HF$ 1:20 (vol/vol) for 45 sec to remove the thermal oxide film 6 in the region except the thermal oxide film on the photoresist 7 for exposing the surface of the silicon substrate 1 and then the photoresist 7 is removed. Thus, an oxide film 8 for preventing silicidation is formed in the region where the photoresist 7 has been formed.

Figure 2A:
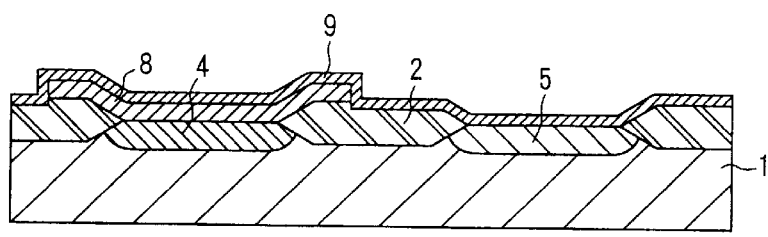
FIG. 2 is a cross section illustrating the latter part of the manufacturing process after that in FIG. 1.
Figure 2B:
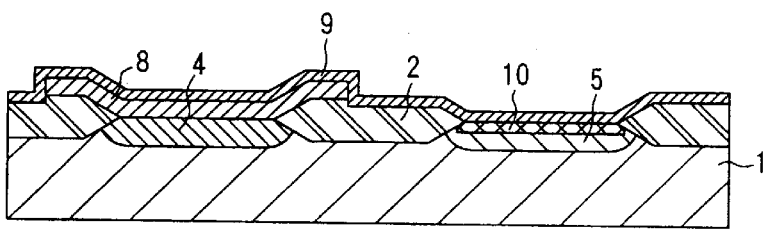
Figure 2C:
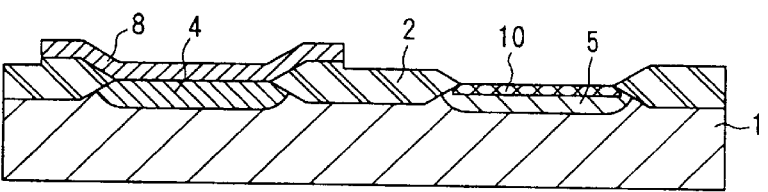
Figure 3A:
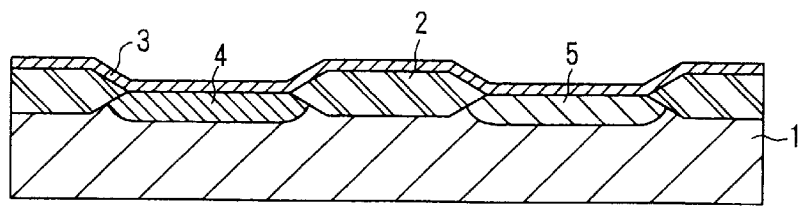
FIG. 3 is a cross section illustrating the first part of a process for manufacturing a semiconductor device comprising a silicide and a non-silicide diffusion layers according to the prior art.
Figure 3B:
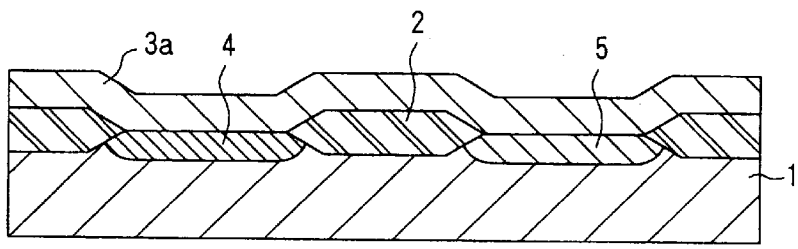
Figure 3C:
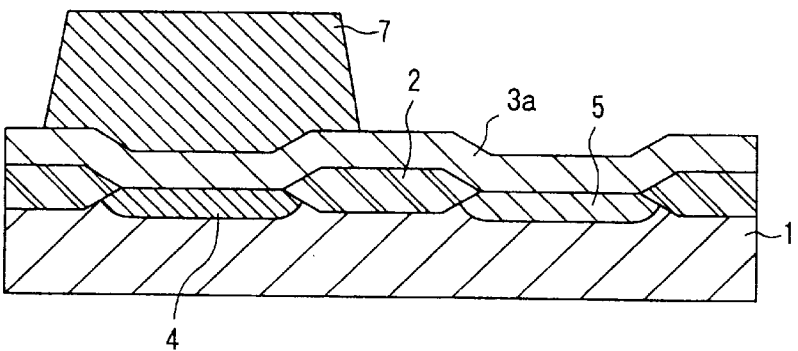
Figure 3D:
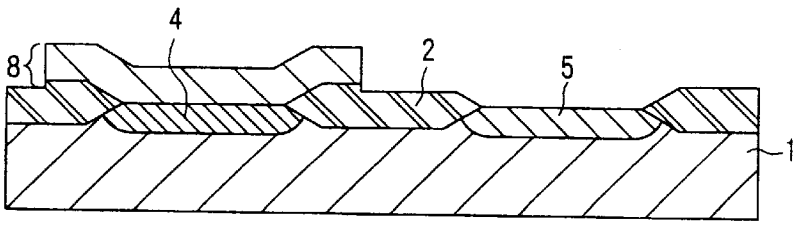
Figure 4A:
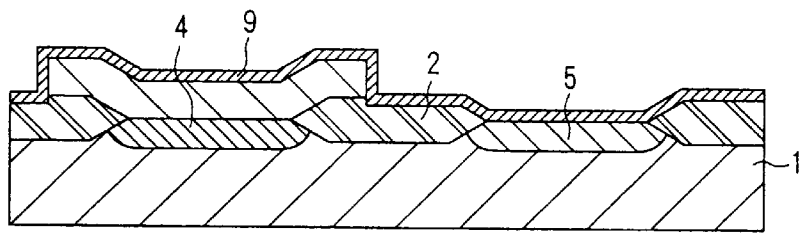
FIG. 4 is a cross section illustrating the latter part of the manufacturing process after that in FIG. 3.
Figure 4B:
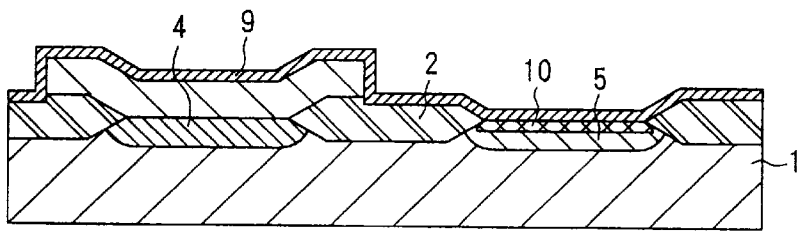
Figure 4C:
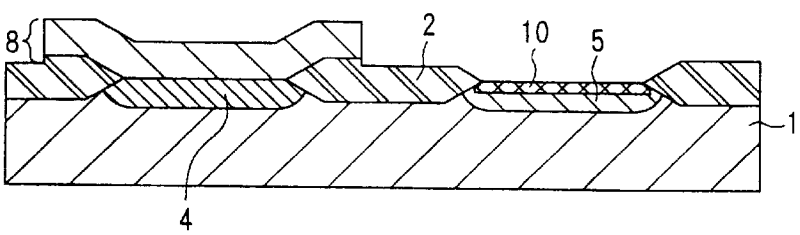

Then, before forming a metal film, the sample is washed with a 1:99 diluted hydrogen fluoride HF solution for 30 sec and then a Ti film 9 is deposited by sputtering to a thickness of 500 Å sputtering (FIG. 2($a$)).

The sample is annealed under an atmosphere of nitrogen $N_2$ gas at 650° C. for 1 min for silicidation, whereby the diffusion layer 5 is silicided to form a silicide diffusion layer 10 on the surface of the diffusion layer 5 as illustrated in FIG. 2(*b*).

Then, the sample is etched with a mixed hydrogen peroxide solution of $NH_4OH:H_2O_2:H_2O=1:1:5$ (vol/vol/vol) at room temperature for 20 min to remove the unreacted Ti film 9 as illustrated in FIG. 2(*c*). Then, the sample is annealed under an atmosphere of nitrogen $N_2$ gas at 850° C. for 1 min for lowering a resistance of the sample.

Thus, the silicide diffusion layer 10 is formed on the surface of the diffusion layer 5 and the diffusion layer 4 as a high quality non-silicide diffusion layer can be formed without Ti sputtering of the diffusion layer 4.

In the heating step for annealing for activating the ions, while annealing, the new thermal oxide film is formed between the protective oxide film 3 and the silicon substrate 1 and the thermal oxide film including the protective oxide film 3 is used as a thermal oxide film 6 for preventing silicidation. It can eliminate a step for separately forming a CVD oxide or a polycrystalline silicon film for preventing silicidation after annealing as in the prior art, leading to shortening of the total manufacturing process for a semiconductor device. It also results in cost reduction.

The thermal oxide film 6 as an oxide film 8 for preventing silicidation is formed by rapid thermal oxidation, so that dopant diffusion in the silicon substrate due to thermal diffusion is minimized and thus a shallow junction suitable for refinement maybe formed. In the heating step for forming the thermal oxide film 6, the film 6 is formed by rapid thermal oxidation, so that a more refined and higher quality thermal oxide film can be provided in comparison to forming an oxide film for preventing silicidation by, for example CVD in the prior art. Since a high quality thermal oxide film can be provided, even a thinner thermal oxide film 6 may be satisfactorily employed as a thermal oxide film for preventing silicidation.

Based on measurement results for the thermal oxide film 6 formed by rapid thermal oxidation, it was found that the film with a thickness of at least 100 Å is adequately reliable as a thermal oxide film for preventing silicidation, and that rapid thermal oxidation at 950° C. for 2 min or more can provide an oxide film adequately reliable as a thermal oxide film for preventing silicidation.

Industrial Applicability

As described above, according to the process for manufacturing a semiconductor device of this invention, oxygen is fed during heating for activating ions implanted into a silicon substrate while forming an oxide film for preventing silicidation, which eliminates need for separately forming an oxide film for preventing silicidation and thus the total process for manufacturing a semiconductor device can be shortened.

In particular, the oxide film for preventing silicidation has a thickness of at least 100 Å, so that it is possible to provide an oxide film for preventing silicidation which ensures adequate reliability.

The oxide film for preventing silicidation is formed by rapid thermal oxidation, so that dopant diffusion due to thermal diffusion is minimized and thus a shallow junction may be formed.

According to the process for manufacturing a semiconductor device of this invention, oxygen is fed during heating for activating ions after ion implantation to form an oxide film for preventing silicidation in an activated region while activating ions, which eliminates need for separately forming an oxide film for preventing silicidation and thus the manufacturing process can be shortened.

In particular, the oxide film for preventing silicidation has a thickness of at least 100 Å, so that it is possible to provide an oxide film for preventing silicidation which ensures adequate reliability.

In the step of heating for activating ions while forming an oxide film for preventing silicidation, rapid thermal oxidation is conducted at 950° C. to 1150° C. both inclusive for 1 min to 10 min both inclusive, so that the oxide film for preventing silicidation can be formed for a short time and thus dopant diffusion due to thermal diffusion can be minimized. Thus, a shallow junction may be formed and a high quality oxide film may be provided, so that even a thinner oxide film compared with the prior art may be adequately reliable as an oxide film for preventing silicidation.

What is claimed is:

1. A process for manufacturing a semiconductor device comprising the steps of:

implanting ions into a silicon substrate;

heating the substrate for activating the ions to form a diffusion layer; and then forming in the diffusion layer silicide and non-silicide diffusion layers;

wherein, in said step of heating the substrate for activating the ions, feeding oxygen to form an oxide film for preventing silicidation.

2. The process for manufacturing a semiconductor device according to claim 1, further comprising forming said oxide film to a thickness of at least 100 Å.

3. The process for manufacturing a semiconductor device according to claim 1 or 2 wherein said heating and feeding steps comprise rapid thermal oxidation.

4. A process for manufacturing a semiconductor device comprising the steps of:

forming insulating regions for separating devices on a silicon substrate;

implanting ions to an activated region made of a silicon layer between the insulating regions for separating devices to form diffusion layers;

heating the activated region to activate the implanted ions and to form an oxide film in said activated region for preventing silicidation;

removing the oxide film for preventing silicidation in a region to be silicided;

forming a refractory metal layer and then annealing the product to silicide the silicon diffusion layer in said region to be silicided; and removing the refractory metal layer, wherein both silicide and non-silicide diffusion layers are formed on the same substrate.

5. The process for manufacturing a semiconductor device according to claim 4, further comprising forming said oxide film for preventing silicidation to a thickness of at least 100 Å.

6. The process for manufacturing a semiconductor device according to claim 4 or 5 wherein said heating step for activating the ions and forming the oxide film for preventing silicidation is rapid thermal oxidation which includes feeding oxygen during heating.

7. The process for manufacturing a semiconductor device according to claim 6 further comprising conducting the rapid thermal oxidation at 950° to 1150° C. both inclusive for 1 min to 10 min both inclusive.

* * * * *